United States Patent
Ko et al.

(10) Patent No.: US 8,168,509 B2
(45) Date of Patent: May 1, 2012

(54) ETCHING METHODS AND METHODS OF MANUFACTURING A CMOS IMAGE SENSOR USING THE SAME

(75) Inventors: Ki-Hyung Ko, Seoul (KR); Byoung-Moon Yoon, Suwon-si (KR); Won-Jun Lee, Seoul (KR); Joon-Sang Park, Seoul (KR); Jun-Youl Yang, Seoul (KR); Seung-Ho Park, Suwon-si (KR); Myung-Jung Pyo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/959,995

(22) Filed: Dec. 3, 2010

(65) Prior Publication Data

US 2011/0136290 A1    Jun. 9, 2011

(30) Foreign Application Priority Data

Dec. 7, 2009    (KR) .................. 10-2009-0120251

(51) Int. Cl.
*H01L 21/30*    (2006.01)

(52) U.S. Cl. ................. 438/455; 438/459; 257/E21.568
(58) Field of Classification Search ................. 438/455, 438/459, 689; 257/E21.568
See application file for complete search history.

(56) References Cited

U.S. PATENT DOCUMENTS

| | | | |
|---|---|---|---|
| 2005/0153557 A1* | 7/2005 | Cho et al. | ............. 438/691 |
| 2008/0251821 A1* | 10/2008 | Ko et al. | ............. 257/292 |
| 2010/0159632 A1* | 6/2010 | Rhodes et al. | ............. 438/73 |

FOREIGN PATENT DOCUMENTS

| | | |
|---|---|---|
| JP | 06-232141 A | 8/1994 |
| KR | 10 2008-0048096 A | 6/2008 |

* cited by examiner

*Primary Examiner* — Khiem D Nguyen
(74) *Attorney, Agent, or Firm* — Lee & Morse, P.C.

(57) ABSTRACT

In an etching method, a thin layer is formed on a first surface of a first substrate doped with first impurities having a first doping concentration. The thin layer is doped with second impurities having a second doping concentration lower than the first doping concentration. A second substrate is formed on the thin layer. A second surface of the first substrate is polished. The polished first substrate is cleaned using a cleaning solution including ammonia and deionized water. The cleaned first substrate is etched to expose the thin layer.

16 Claims, 8 Drawing Sheets

ETCHING METHODS AND METHODS OF MANUFACTURING A CMOS IMAGE SENSOR USING THE SAME

BACKGROUND

1. Field

Example embodiments relate to etching methods and methods of manufacturing a CMOS image sensor (CIS) using the same. More particularly, example embodiments relate to methods of manufacturing a CIS having a backside illumination (BSI) structure and etching methods used therein.

2. Description of the Related Art

A CIS having a frontside illumination (FSI) structure may have an incident light loss by metal wirings, and thus a CIS having a BSI structure has been developed. The BSI structure CIS may be manufactured by forming an epitaxial layer, a photodiode, circuit elements and protection layer on a sacrificial substrate, foaming a support substrate on the protection layer and removing the sacrificial substrate to expose the epitaxial layer.

SUMMARY

Example embodiments provide a method of etching a sacrificial substrate in a manufacture of a CIS having a BSI structure.

Example embodiments provide a method of manufacturing a CIS having a BSI structure using an etching method of a sacrificial substrate.

According to an example embodiment, there is provided an etching method, including forming a thin layer on a first surface of a first substrate, the first substrate being doped with first impurities having a first doping concentration and the thin layer being doped with second impurities having a second doping concentration lower than the first doping concentration, forming a second substrate on the thin layer, polishing a second surface of the first substrate to provide a polished first substrate, cleaning the polished first substrate using a cleaning solution including ammonia and deionized water to provide a cleaned first substrate, and etching the cleaned first substrate to expose the thin layer.

The thin layer may be grown by an epitaxial growth process.

The first substrate and the thin layer may include silicon, and the first and second impurities may include boron.

The etching of the cleaned first substrate may be performed using an etching solution including fluoric acid, nitric acid, acetic acid and phosphoric acid.

A volume ratio between ammonia and deionized water in the cleaning solution may be 5:1 to about 30:1.

The cleaning solution further may include peroxide.

The polishing of the second surface of the first substrate may lower a doping concentration of first impurities at a portion of the first substrate to be less than that of the first doping concentration to provide a lowered doping concentration, and the cleaning of the polished first substrate may remove the portion of the first substrate having the lowered doping concentration.

The cleaning of the polished first substrate may be performed by a spin spray process, a DI sonic process, or a dip process.

The method may further include grinding the second surface of the first substrate prior to polishing the second surface of the first substrate.

The polishing of the second surface of the first substrate may be performed by a CMP process on the second surface of the first substrate.

According to an example embodiment, there is provided a method of manufacturing a CIS, including foaming an epitaxial layer on a first surface of a first substrate, the first substrate being doped with first impurities having a first doping concentration and the epitaxial layer being doped with second impurities having a second doping concentration lower than the first doping concentration, forming a photodiode and circuit elements at a portion of and on the epitaxial layer, respectively, the circuit elements electrically connected to the photodiode, forming a protection layer on the epitaxial layer to cover the photodiode and the circuit elements, forming a second substrate on the protection layer, polishing a second surface of the first substrate to provide a polished first substrate, cleaning the polished first substrate using a cleaning solution including ammonia and deionized water to provide a cleaned first substrate; and etching the cleaned first substrate to expose the epitaxial layer.

The first substrate and the epitaxial layer may include silicon, and the first and second impurities may include boron.

The etching of the cleaned first substrate may be performed using an etching solution including fluoric acid, nitric acid, acetic acid and phosphoric acid.

A volume ratio between ammonia and deionized water in the cleaning solution may be 5:1 to about 30:1.

The cleaning solution further may include peroxide.

The polishing of the second surface of the first substrate may lower a doping concentration of first impurities at a portion of the first substrate to be less than that of the first doping concentration to provide a lowered doping concentration, and the cleaning of the polished first substrate may remove the portion of the first substrate having the lowered doping concentration.

The method may further include forming a color filter layer on the exposed epitaxial layer; and forming a microlens on the color filter layer.

The forming of the photodiode and the circuit elements may include forming a gate structure on the epitaxial layer, forming the photodiode at an upper portion of the epitaxial layer adjacent to the gate structure, and forming a wiring electrically connected to the gate structure.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
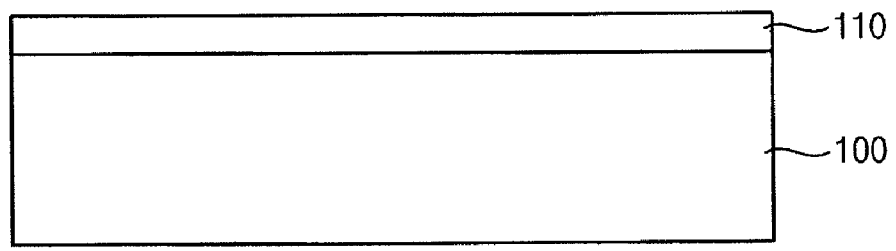
FIGS. 1 to 6 illustrate cross-sectional views relating to an etching method in accordance with example embodiments.

Korean Patent Application No. 10-2009-0120251, filed on Dec. 7, 2009, in the Korean Intellectual Property Office, and entitled: "Etching Methods and Methods of Manufacturing a Cmos Image Sensor Using the Same," is incorporated by reference herein in its entirety.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "upper" or "above" other elements or features would then be oriented "below" the other elements or features. Thus, the exemplary term "upper" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 6 are cross-sectional views illustrating an etching method in accordance with example embodiments.

Referring to FIG. 1, a thin film 110 may be formed on a first surface of a first substrate 100.

The first substrate 100 may include a semiconductor material such as silicon, germanium, and the like. In the present embodiment, the first substrate 100 includes silicon. The first substrate 100 may include first impurities having a first doping concentration. In example embodiments, the first substrate 100 may include p-type impurities having a doping concentration of about $1\times10^{18}$ cm$^{-3}$ to about $9\times10^{18}$ cm$^{-3}$.

The thin film 110 may be formed using a semiconductor material such as silicon, germanium, and the like. In an example embodiment, the thin film 110 may be formed by an epitaxial growth process. Particularly, a chemical vapor deposition (CVD) process using a silicon source gas such as $SiH_4$, $SiCl_4$, and the like or a germanium source gas such as $GeH_4$, $GeCl_4$, and the like may be performed to form the thin film 110. Alternatively, the thin film 110 may be formed by a reduced pressure chemical vapor deposition (RPCVD) process, a low pressure high vacuum chemical vapor deposition (LPCVD) process, an ultra high vacuum chemical vapor deposition (UHVCVD) process, a metal organic chemical vapor deposition (MOCVD) process, and the like.

In the present embodiment, the thin film 110 is formed using a silicon source gas and p-type impurity source gas such as $B_2H_6$, and thus the thin film 110 may include silicon doped with boron having a second doping concentration. The second doping concentration may be lower than the first doping concentration. In example embodiments, the thin film 110 may include silicon doped with boron having a second doping concentration of about $1\times10^{14}$ cm$^{-3}$ to about $9\times10^{14}$ cm$^{-3}$. Meanwhile, a plurality of circuit elements (not shown) may be formed on or in the thin film 110.

Figure 2:
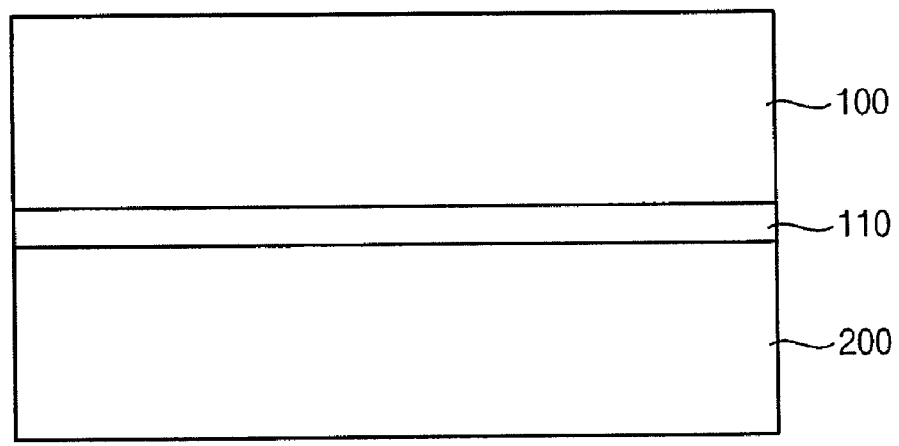

Referring to FIG. 2, a second substrate 200 may be formed on the thin film 110. The second substrate 200 may include a semiconductor material such as silicon, germanium, and the like or an insulating material. A protection layer (not shown) covering the circuit elements may be further formed on the thin film 110, prior to forming the second substrate 200. A structure including the first and second substrates 100 and 200 and the thin film 110 may be turned over for the convenience of process.

Figure 3:
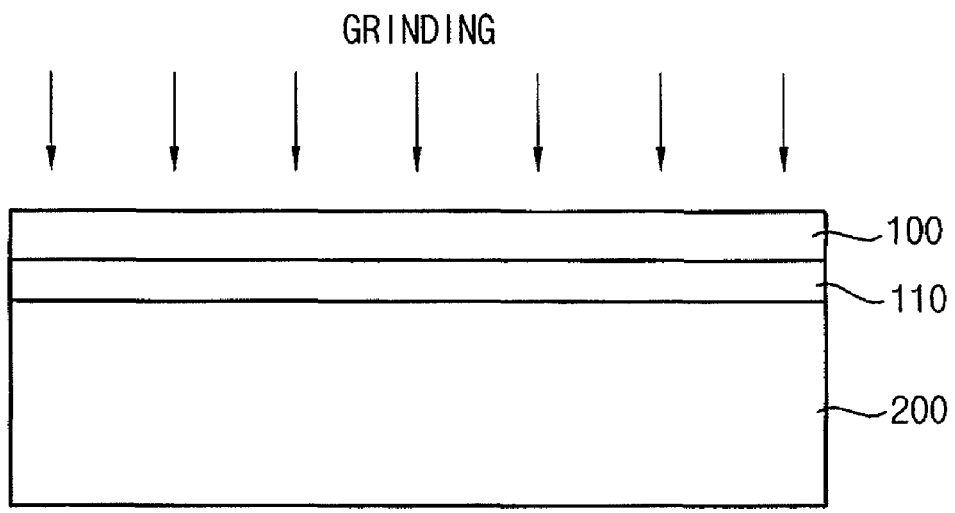

Referring to FIG. 3, a second surface of the first substrate 100 may be partially removed. When the first substrate 100 has a large thickness, the second surface of the first substrate 100 may be removed by grinding. In this case, cracks may be generated near the second surface of the first substrate 100. Alternatively, when the first substrate 100 has a small thickness, the grinding process may be omitted.

Figure 4:
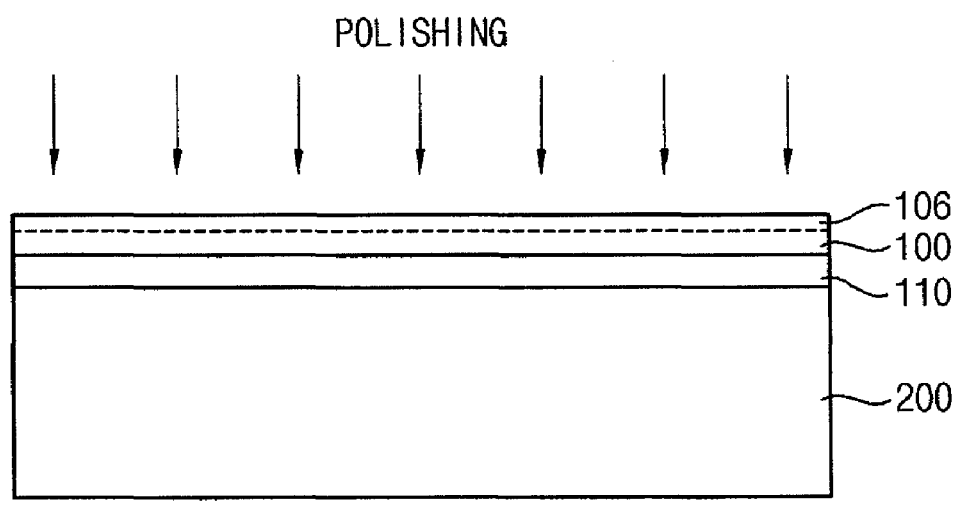

Referring to FIG. 4, the ground second surface of the first substrate 100 may be polished. Thus, the cracks generated in the grinding process may be removed. The polishing process may be performed, e.g., by a chemical mechanical polishing (CMP) process.

In the polishing process, a portion of the first impurities doped in the first substrate 100 may be lost, and thus a lightly-doped layer 106 having a doping concentration lower than that of a lower portion of the first substrate 100 may be formed, for example, as a result of the polishing, at the second surface of the first substrate 100.

Figure 5:
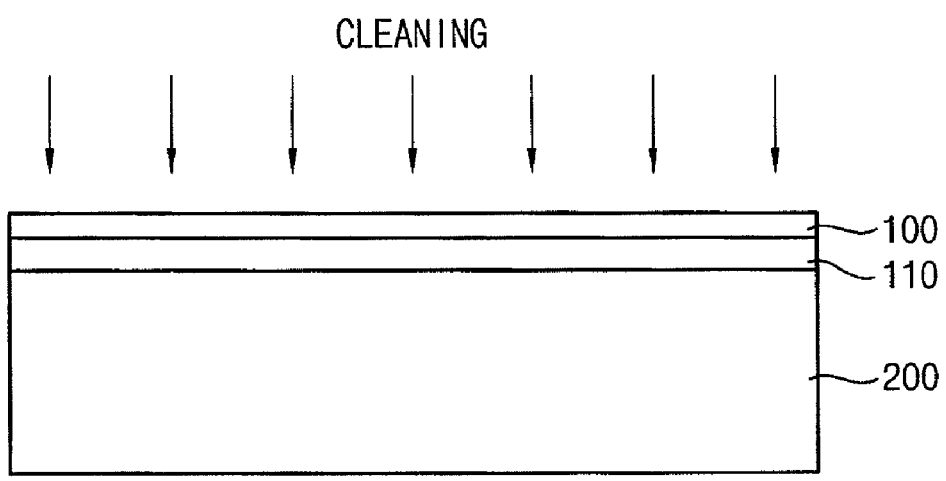

Referring to FIG. 5, the second surface of the first substrate 100 may be cleaned using a cleaning solution.

In an example embodiment, the cleaning solution may include ammonia and deionized water. In the cleaning solution, a volume ratio between ammonia and deionized water may be about 5:1 to about 30:1. The cleaning solution may further include an oxidant for curing damages of the second surface of the first substrate 100 generated during the cleaning process. The oxidant may include peroxide.

The cleaning process may be performed by a spin process such as a spin spray process, a deionized (DI) sonic process, and the like or a dip process. In an example embodiment, the cleaning process may be performed for about 5 to about 6 minutes. The lightly-doped layer 106 may be effectively removed by the cleaning process.

Figure 6:
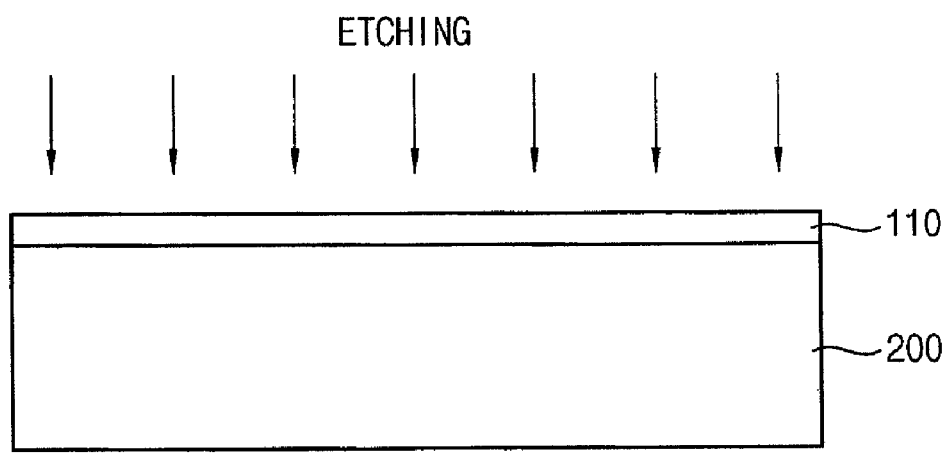

Referring to FIG. 6, the first substrate 100 that has been cleaned may be removed using an etching solution.

In an example embodiment, the etching solution may include fluoric acid, nitric acid, acetic acid and phosphoric acid. The etching solution may etch the first substrate 100 that is a highly-doped layer more than the lightly-doped layer 106 that has been removed in the previous cleaning process. Thus, the first substrate 100 may be sufficiently removed by the etching process.

The first substrate 100 that is more highly doped than the thin film 110 may be effectively removed by the above processes. That is, the first substrate 100 may be ground and polished, and the lightly-doped layer 106 that may be formed on a surface of the first substrate 100 by the polishing process may be removed by a cleaning solution. Thus, the remaining first substrate 100 may be completely removed by an etching process using an etching solution having a high etch rate to a highly-doped layer.

FIGS. 7 to 12 are cross-sectional views illustrating a method of manufacturing a CIS in accordance with example embodiments.

Figure 7:
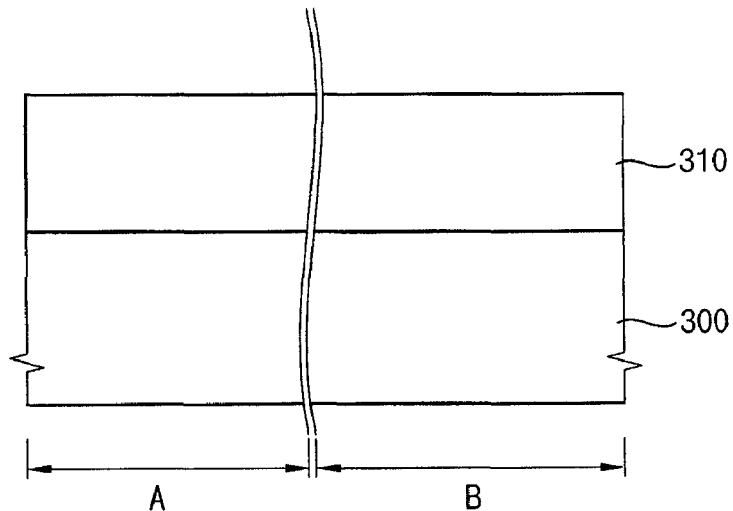
FIGS. 7 to 12 illustrate cross-sectional views relating to a method of manufacturing a CIS in accordance with example embodiments.

Referring to FIG. 7, an epitaxial layer 310 may be formed on a first surface of a first substrate 300 that may be divided into an active pixel sensor (APS) array region A and a peripheral region B.

The first substrate 300 may include a semiconductor material such as silicon, germanium, and the like. The first substrate 300 may be doped with p-type or n-type impurities having a first doping concentration. In an example embodiment, the first substrate 300 may include silicon doped with boron having a doping concentration of about $1 \times 10^{18}$ cm$^{-3}$ to about $9 \times 10^{18}$ cm$^{-3}$.

The epitaxial layer 310 may be formed by an epitaxial growth process. The epitaxial growth process may be performed by a CVD process using a silicon source gas such as SiH$_4$, SiCl$_4$, and the like or a germanium source gas such as GeH$_4$, GeCl$_4$, and the like. Alternatively, the epitaxial growth process may be performed by an RPCVD process, an LPCVD process, a UHVCVD process, an MOCVD process, and the like.

In the present embodiment, the epitaxial layer 310 may be formed using a silicon source gas and p-type impurity source gas such as B$_2$H$_6$, and thus the epitaxial layer 310 may include silicon doped with boron having a second doping concentration. The second doping concentration may be lower than the first doping concentration. In an example embodiment, the second doping concentration may be about $1 \times 10^{14}$ cm$^{-3}$ to about $9 \times 10^{14}$ cm$^{-3}$.

A p-well (not shown) or an n-well (not shown) may be further formed at a lower portion of the epitaxial layer 310.

Figure 8:
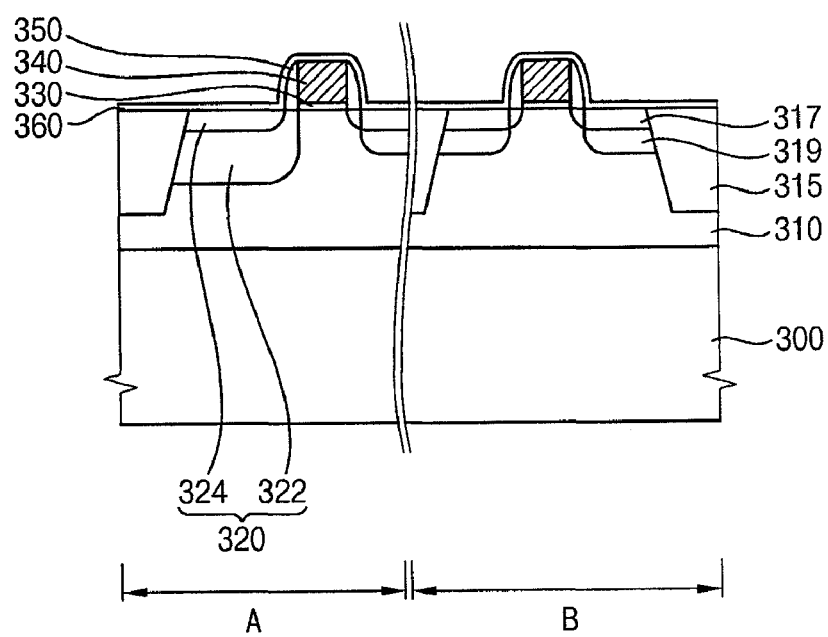

Referring to FIG. 8, an isolation layer 315 may be formed on the epitaxial layer 310, and a photodiode 320 and a first transistor may be formed in the APS array region A and a second transistor may be formed in the peripheral region B.

Particularly, the isolation layer 315 may be formed by a shallow trench isolation (STI) process using silicon oxide.

An insulation layer and a conductive layer may be formed on the first surface of the first substrate 300, and the insulation layer and the conductive layer may be patterned to form a gate insulation layer 330 and a gate electrode 340 both in the APS array region A and the peripheral region B. The insulation layer may be formed using an oxide, a nitride and/or an oxynitride by a CVD process, an LPCVD process, a PECVD process, an HDP-CVD process, and the like. The conductive layer may be formed using doped polysilicon, a metal and/or a metal silicide by a CVD process, an ALD process, an HDP-CVD process, and the like.

A first mask (not shown) exposing a portion of the APS array region A may be formed on the epitaxial layer 310, the gate insulation layer 330 and the gate electrode 340. An ion implantation process may be performed using the first mask as an ion implantation mask so that first impurities may be doped into an upper portion of the epitaxial layer 310. In an example embodiment, n-type impurities may be doped to form an n-type impurity layer 322. The n-type impurity layer 322 may be formed at an upper portion of the epitaxial layer 310 in the APS array region A adjacent to a first side of the gate electrode 340. The first mask may be removed.

A second mask (not shown) exposing a portion of the APS array region A and a portion of the peripheral region B may be formed on the epitaxial layer 310, the gate insulation layer 330 and the gate electrode 340. An ion implantation process may be performed using the second mask as an ion implantation mask so that second impurities may be doped into upper portions of the epitaxial layer 310. In an example embodiment, n-type impurities may be lightly doped to form a lightly-doped impurity layer 317. The lightly-doped impurity layer 317 may be formed at an upper portion of the epitaxial layer 310 in the APS array region A adjacent to a second side of the gate electrode 340 and at upper portions of the epitaxial layer 310 in the peripheral region B adjacent to both sides of the gate electrode 340. The second mask may be removed.

A spacer layer covering the gate electrode 340 and the gate insulation layer 330 may be formed on the epitaxial layer 310, and patterned to form a spacer 350 on sidewalls of the gate electrode 340 and the gate insulation layer 330. The spacer layer may be formed using silicon nitride.

A third mask (not shown) exposing a portion of the APS array region A may be formed on the epitaxial layer 310, the gate electrode 340 and the spacer 350. An ion implantation process may be performed using the third mask as an ion implantation mask so that third impurities may be doped into an upper portion of the epitaxial layer 310. In an example embodiment, p-type impurities may be doped to form a p-type impurity layer 324. The p-type impurity layer 324 may be formed on the n-type impurity layer 322 in the APS array region A. Thus, the photodiode 320 having the n-type impurity layer 322 and the p-type impurity layer 324 sequentially stacked may be formed in the epitaxial layer 310. The third mask may be removed.

A fourth mask (not shown) exposing a portion of the APS array region A and a portion of the peripheral region B may be formed on the epitaxial layer 310, the gate electrode 340 and the spacer 350. An ion implantation process may be performed using the fourth mask as an ion implantation mask so that fourth impurities may be doped into upper portions of the epitaxial layer 310. In an example embodiment, n-type impurities may be heavily doped to form a heavily-doped impurity layer 319. The heavily-doped impurity layer 319 may be formed more deeply than the lightly-doped impurity layer 317, and thus an impurity region including the lightly-doped impurity layer 317 and the heavily-doped impurity layer 319 may have a lightly doped drain (LDD) structure. Alternatively, the impurity region may be formed to have a single-layered structure.

The gate electrode 340, the gate insulation layer 330 and the spacer 350 may form a gate structure, and the gate structure and the impurity region in the APS array region A may define the first transistor. In an example embodiment, the first transistor may be a transfer transistor. In example embodiments, a plurality of first transistors may be formed in the APS array region A, and the first transistors may serve as a transfer transistor, a reset transistor, a drive transistor and a select transistor, respectively. In FIG. 8, the impurity region adjacent to the second side of the gate electrode 340 may serve as a floating diffusion region. The gate structure and the impurity region in the peripheral region B may define the second transistor. In example embodiments, a plurality of second transistors may be formed in the peripheral region B.

The photodiode 320 and the first and second transistors may be formed in another order different from the above-illustrated order.

An etch stop layer 360 may be formed on the epitaxial layer 310 to cover the gate structure. The etch stop layer 360 may be formed using silicon nitride.

Figure 9:
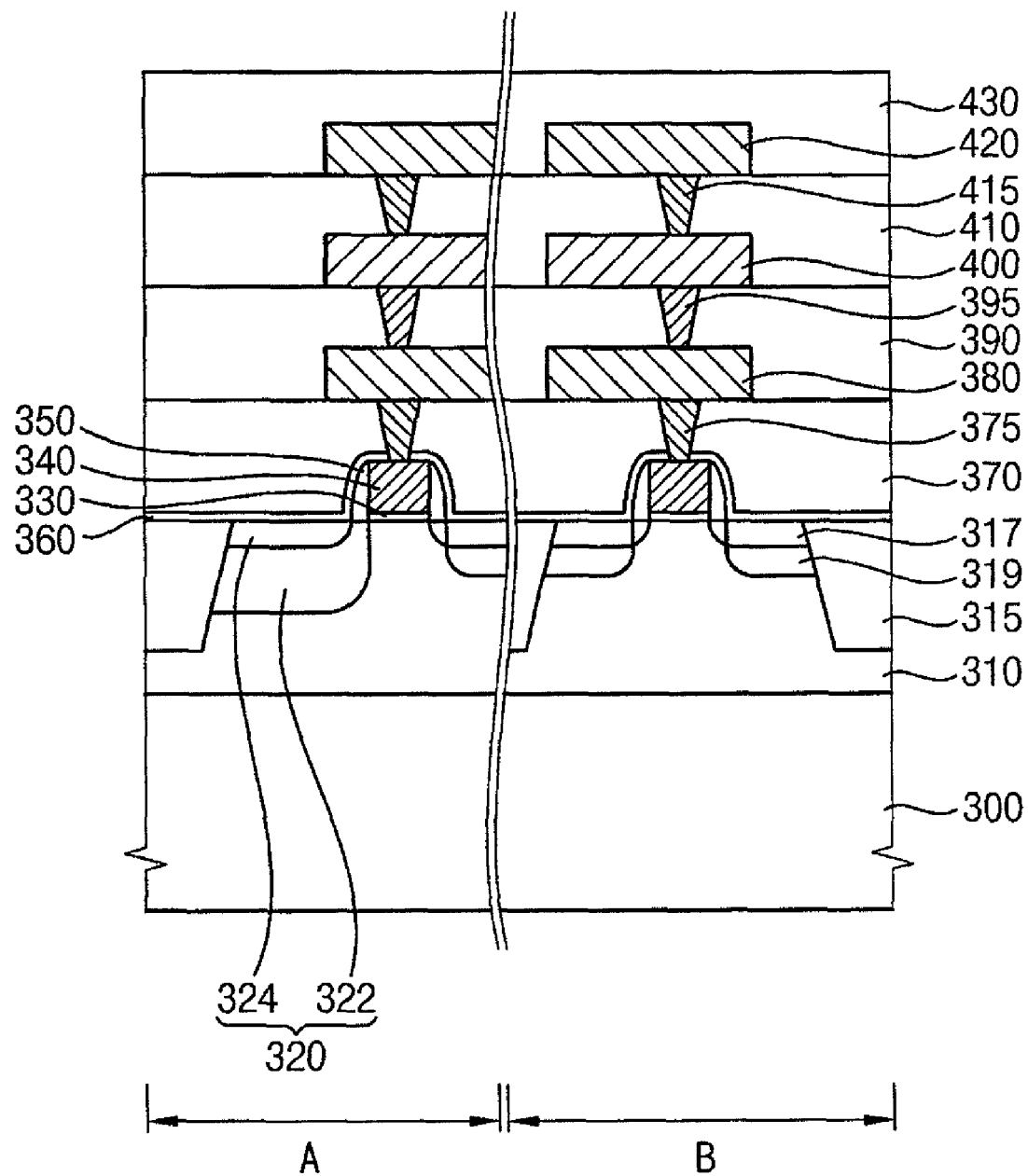

Referring to FIG. 9, a first insulating interlayer 370 may be formed on the etch stop layer 360, and a first opening (not shown) may be formed through the first insulating interlayer 370 and the etch stop layer 360 to expose a top surface of the gate electrode 340. The first insulating interlayer 370 may be formed using an oxide such as silicon oxide. A first conductive layer may be formed on the gate electrode 340 and the first insulating interlayer 370 to fill the first opening. The first conductive layer may be patterned to form a first plug 375 in the first opening and a first wiring 380 electrically connected to the first plug 375. The first conductive layer may be formed using doped polysilicon, a metal and/or a metal nitride. A barrier layer (not shown) may be further formed on an inner wall of the first opening before forming the first plug 375 and the first wiring 380. Alternatively, the first plug 375 and the first wiring 380 may be formed using different materials.

In other example embodiments, an opening (not shown) may be formed through the first insulating interlayer 370 to expose the impurity region and a conductive layer (not shown) may be formed on the impurity region and the first insulating interlayer 370 to fill the opening. The conductive layer may be patterned to form a plug (not shown) and a wiring (not shown) that may be electrically connected to the impurity region.

A second insulating interlayer 390 may be formed on the first insulating interlayer 370 to cover the first wiring 380, and a second opening (not shown) may be formed through the second insulating interlayer 390 to expose a top surface of the first wiring 380. The second insulating interlayer 390 may be formed using an oxide such as silicon oxide. A second conductive layer may be formed on the first wiring 380 and the second insulating interlayer 390 to fill the second opening. The second conductive layer may be patterned to form a second plug 395 in the second opening and a second wiring 400 electrically connected to the second plug 395. The second conductive layer may be formed using doped polysilicon, a metal and/or a metal nitride. Alternatively, the second plug 395 and the second wiring 400 may be formed using different materials.

A third insulating interlayer 410 may be formed on the second insulating interlayer 390 to cover the second wiring 400, and a third opening (not shown) may be formed through the third insulating interlayer 410 to expose a top surface of the second wiring 400. The third insulating interlayer 410 may be formed using an oxide such as silicon oxide. A third conductive layer may be formed on the second wiring 400 and the third insulating interlayer 410 to fill the third opening. The third conductive layer may be patterned to form a third plug 415 in the third opening and a third wiring 420 electrically connected to the third plug 415. The third conductive layer may be formed using doped polysilicon, a metal and/or a metal nitride. Alternatively, the third plug 415 and the third wiring 420 may be formed using different materials.

A protection layer 430 may be formed on the third insulating interlayer 410 to cover the third wiring 420. The protection layer 430 may be formed using silicon oxide or silicon nitride.

In FIG. 8, a three-layered wring structure is shown, however, the scope of the present invention is not limited thereto. That is, any multiple-layered wiring structure may be covered by the scope of the present invention.

Figure 10:
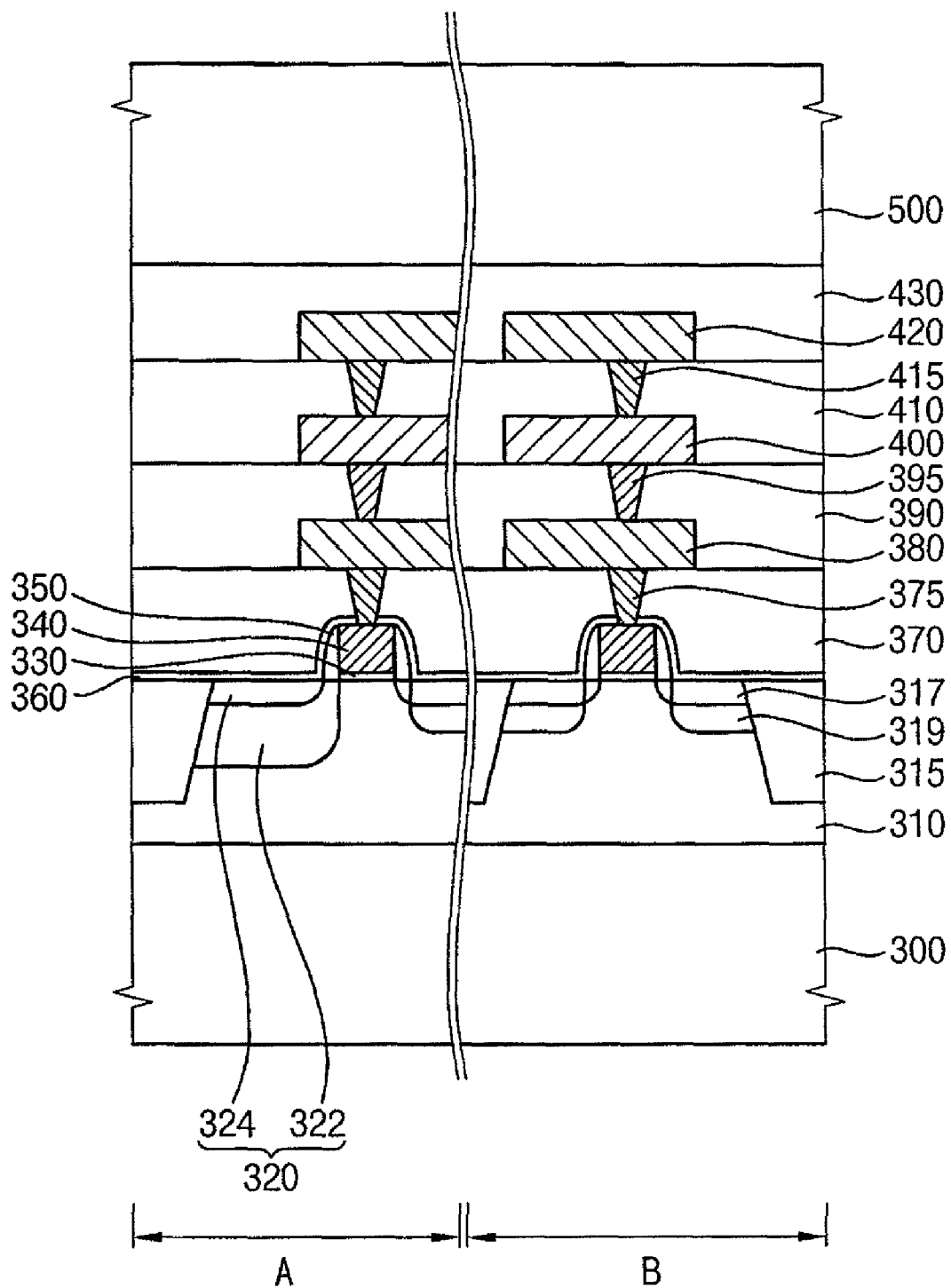

Referring to FIG. 10, a second substrate 500 may be formed on the protection layer 430. The second substrate 500 may include a semiconductor material such as silicon, germanium, and the like or an insulating material. For the convenience of process, a structure including the first and second substrates 300 and 500, the epitaxial layer 310, the insulating interlayers 370, 390 and 410, the wirings 380, 400 and 420, the plugs 375, 395 and 415, and the protection layer 430 may be turned over.

Figure 11:
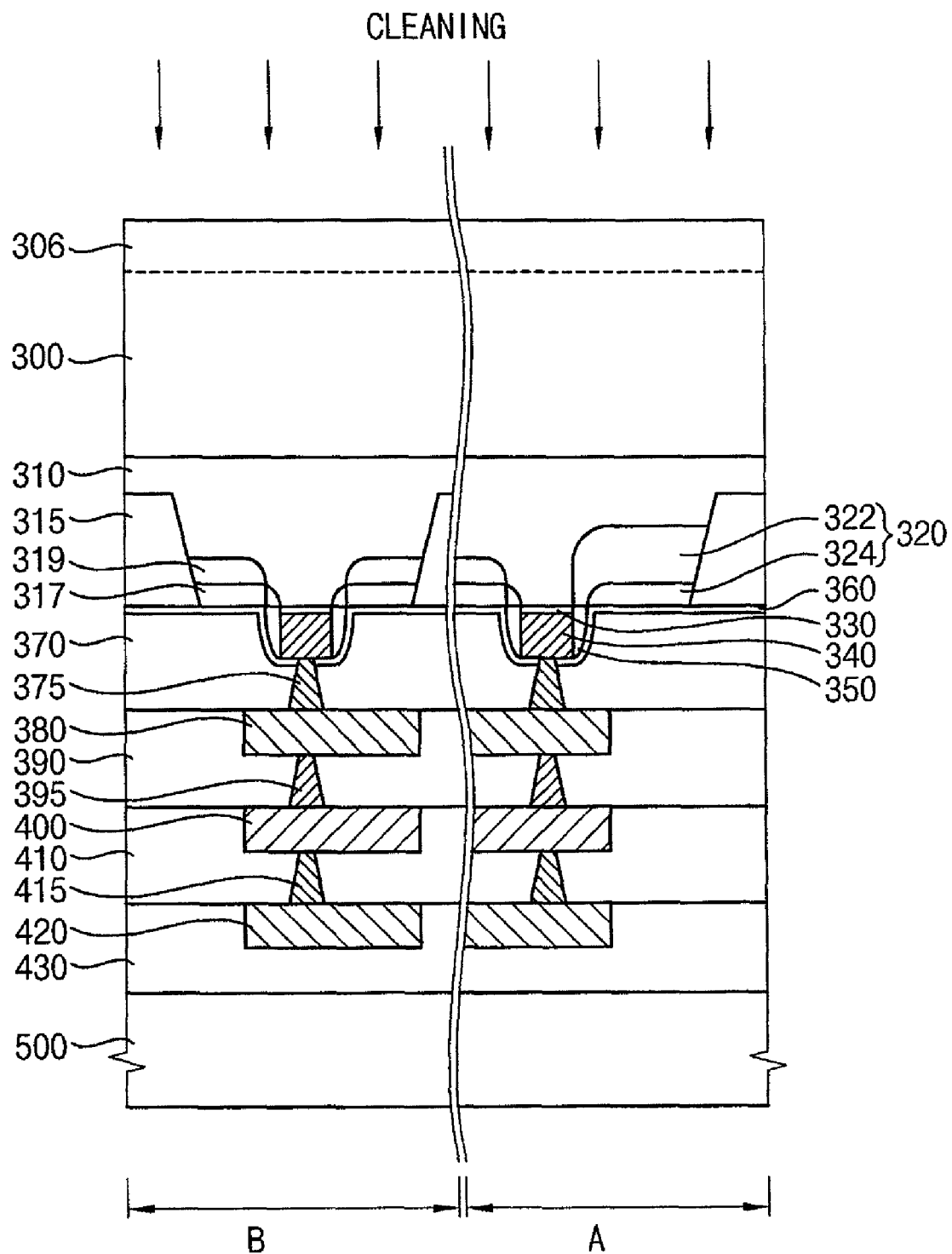

Referring to FIG. 11, a second surface of the first substrate 300 may be partially removed. When the first substrate 300 has a large thickness, the second surface of the first substrate 300 may be removed by grinding. In this case, cracks may be generated near the second surface of the first substrate 300. Alternatively, when the first substrate 300 has a small thickness, the grinding process may be omitted. The ground second surface of the first substrate 300 may be polished. Thus, the cracks generated in the grinding process may be removed. The polishing process may be performed, e.g., by a CMP process. In the polishing process, a portion of the impurities doped in the first substrate 300 may be lost, and thus a lightly-doped layer 306 having a doping concentration lower than that of a lower portion of the first substrate 300 may be formed at the second surface of the first substrate 300.

Figure 12:
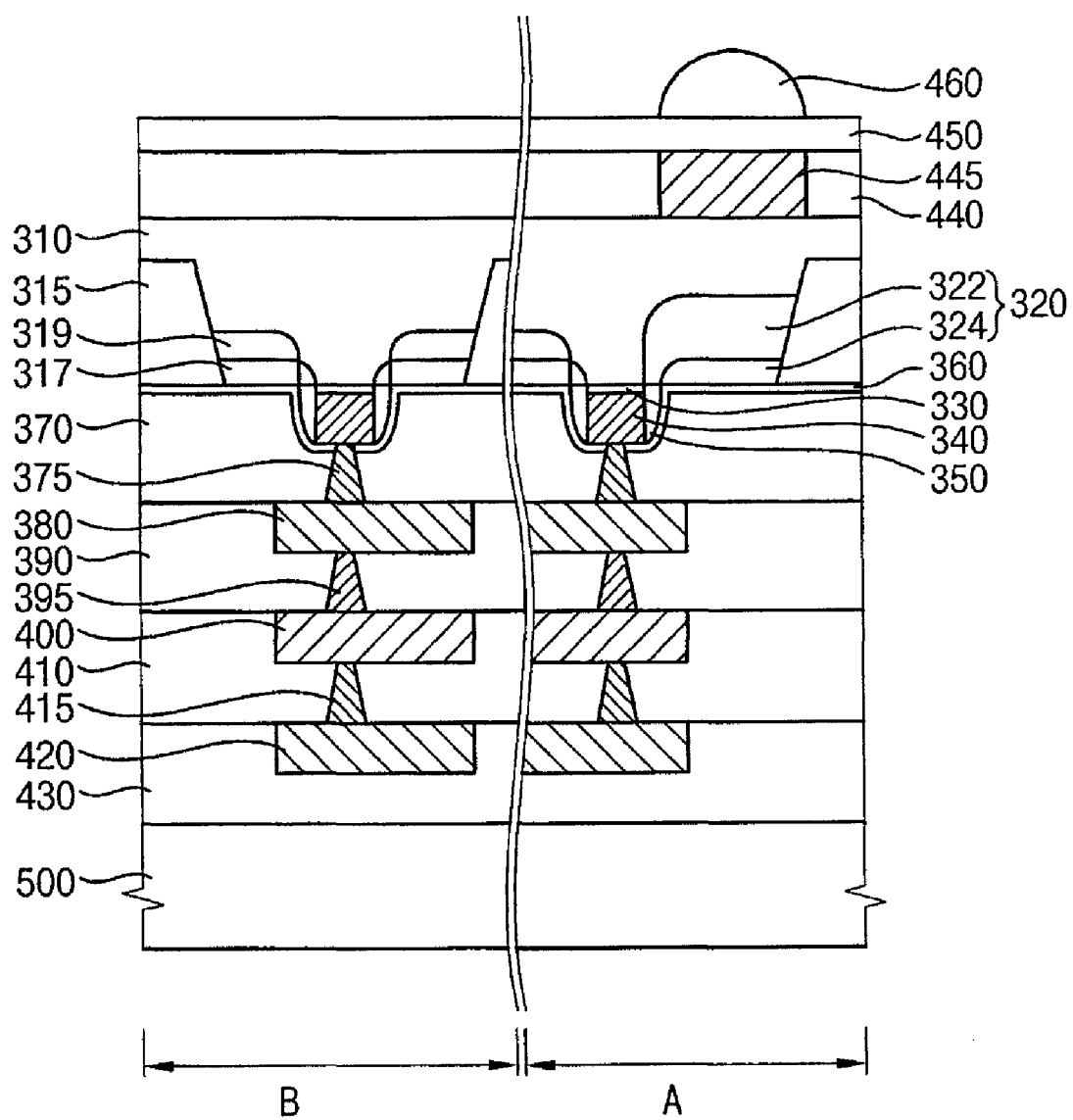

Referring to FIG. 12, the second surface of the first substrate 300 may be cleaned using a cleaning solution. In an example embodiment, the cleaning solution may include ammonia and deionized water. In the cleaning solution, a volume ratio between ammonia and deionized water may be about 5:1 to about 30:1. The cleaning solution may further include an oxidant for curing damages of the second surface of the first substrate 300 generated during the cleaning process. The oxidant may include peroxide. The cleaning process may be performed by a spin process such as a spin spray process, a DI sonic process, and the like or a dip process. In an example embodiment, the cleaning process may be performed for about 5 to about 6 minutes. The lightly-doped layer 306 may be effectively removed by the cleaning process.

The first substrate 300 that has been cleaned may be removed using an etching solution. In an example embodiment, the etching solution may include fluoric acid, nitric acid, acetic acid and phosphoric acid. The etching solution may etch the first substrate 300 that is a highly-doped layer more than the lightly-doped layer 306 that has been removed in the previous cleaning process. Thus, the first substrate 300 may be sufficiently removed by the etching process.

An insulation layer 440 may be formed on the epitaxial layer 310, and a color filter layer 445 overlapping the photodiode 320 may be formed through the insulation layer 440. In FIG. 12, only one color filter layer 445 is shown, however, at least three color filter layers may be formed in the APS array region A.

A planarization layer 450 may be formed on the color filter layer 445 and the insulation layer 440, and a microlens 460 overlapping the color filter layer 445 may be formed on the planarization layer 450 to complete the CIS.

According to example embodiments, in a manufacture of a CIS having a BSI structure, after polishing a sacrificial substrate, the sacrificial substrate may be cleaned using a solution including ammonia and deionized water. Thus, a lightly-doped layer on the sacrificial substrate may be removed, and other portions of the sacrificial substrate heavily doped may be effectively removed. A color filter layer and a lens layer may be formed on the exposed epitaxial layer, and thus removing the sacrificial layer clearly is important.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An etching method, comprising:
    forming a thin layer on a first surface of a first substrate, the first substrate being doped with first impurities having a first doping concentration and the thin layer being doped with second impurities having a second doping concentration lower than the first doping concentration;
    forming a second substrate on the thin layer;
    polishing a second surface of the first substrate to provide a polished first substrate;
    cleaning the polished first substrate using a cleaning solution including ammonia and deionized water to provide a cleaned first substrate, wherein the polishing of the second surface of the first substrate lowers a doping concentration of the first impurities at an exposed portion of the first substrate to be less than the first doping concentration to provide a lowered doping concentration, and the cleaning of the polished first substrate removes the exposed portion of the first substrate having the lowered doping concentration; and
    etching the cleaned first substrate to remove the first substrate and expose the thin layer.

2. The method as claimed in claim 1, wherein the thin layer is grown by an epitaxial growth process.

3. The method as claimed in claim 1, wherein the first substrate and the thin layer include silicon, and the first and second impurities include boron.

4. The method as claimed in claim 3, wherein the etching of the cleaned first substrate is performed using an etching solution including fluoric acid, nitric acid, acetic acid and phosphoric acid, the etching solution having a higher etch rate with respect to higher doped material.

5. The method as claimed in claim 1, wherein a volume ratio between ammonia and deionized water in the cleaning solution is 5:1 to about 30:1.

6. The method as claimed in claim 1, wherein the cleaning solution further includes peroxide.

7. The method as claimed in claim 1, wherein cleaning the polished first substrate is performed by a spin spray process, a DI sonic process, or a dip process.

8. The method as claimed in claim 1, further comprising grinding the second surface of the first substrate prior to polishing the second surface of the first substrate.

9. The method as claimed in claim 1, wherein polishing the second surface of the first substrate is performed by a CMP process on the second surface of the first substrate.

10. A method of manufacturing a CMOS image sensor (CIS), the method comprising:
    forming an epitaxial layer on a first surface of a first substrate, the first substrate being doped with first impurities having a first doping concentration and the epitaxial layer being doped with second impurities having a second doping concentration lower than the first doping concentration;
    forming a photodiode and circuit elements at a portion of and on the epitaxial layer, respectively, the circuit elements electrically connected to the photodiode;
    forming a protection layer on the epitaxial layer to cover the photodiode and the circuit elements;
    forming a second substrate on the protection layer;
    polishing a second surface of the first substrate to provide a polished first substrate;
    cleaning the polished first substrate using a cleaning solution including ammonia and deionized water to provide a cleaned first substrate, wherein the polishing of the second surface of the first substrate lowers a doping concentration of the first impurities at an exposed portion of the first substrate to be less than the first doping concentration to provide a lowered doping concentration, and the cleaning of the polished first substrate removes the exposed portion of the first substrate having the lowered doping concentration; and
    etching the cleaned first substrate to remove the first substrate and expose the epitaxial layer.

11. The method as claimed in claim 10, wherein the first substrate and the epitaxial layer include silicon, and the first and second impurities include boron.

12. The method as claimed in claim 11, wherein the etching of the cleaned first substrate is performed using an etching solution including fluoric acid, nitric acid, acetic acid and phosphoric acid, the etching solution having a higher etch rate with respect to higher doped material.

13. The method as claimed in claim 10, wherein a volume ratio between ammonia and deionized water in the cleaning solution is 5:1 to about 30:1.

14. The method as claimed in claim 10, wherein the cleaning solution further includes peroxide.

15. The method as claimed in claim 10, further comprising forming a color filter layer on the exposed epitaxial layer; and
forming a microlens on the color filter layer.

16. The method as claimed in claim 10, wherein forming the photodiode and the circuit elements includes:
forming a gate structure on the epitaxial layer;
forming the photodiode at an upper portion of the epitaxial layer adjacent to the gate structure; and
forming a wiring electrically connected to the gate structure.

* * * * *